(12) United States Patent
Mayer et al.

(10) Patent No.: US 11,142,453 B2
(45) Date of Patent: Oct. 12, 2021

(54) MEMS DEVICE STRESS-REDUCING STRUCTURE

(71) Applicant: TDK Corporation, Tokyo (JP)

(72) Inventors: Klaus Mayer, Munich (DE); Christian Siegel, Tuntenhausen (DE); Anton Leidl, Hohenbrunn (DE); Wolfgang Pahl, Munich (DE); Stefan Stufler, Munich (DE)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/434,105

(22) Filed: Jun. 6, 2019

(65) Prior Publication Data
US 2019/0375630 A1   Dec. 12, 2019

(30) Foreign Application Priority Data
Jun. 6, 2018  (DE) .................. 102018113498.3

(51) Int. Cl.
 *B81C 1/00* (2006.01)
 *B81B 3/00* (2006.01)
 *H01L 23/00* (2006.01)
 *B81B 7/00* (2006.01)
(52) U.S. Cl.
 CPC ........ *B81C 1/00325* (2013.01); *B81B 3/0072* (2013.01); *B81B 7/0048* (2013.01); *B81C 1/00134* (2013.01); *H01L 24/48* (2013.01); *B81C 2203/01* (2013.01); *H01L 2224/48247* (2013.01); *H01L 2224/73257* (2013.01)

(58) Field of Classification Search
CPC combination set(s) only.
See application file for complete search history.

(56) References Cited

U.S. PATENT DOCUMENTS

| | | | |
|---|---|---|---|
| 7,014,093 B2 | 3/2006 | Houle et al. | |
| 7,326,586 B2 | 2/2008 | Asai | |
| 7,544,531 B1 | 6/2009 | Grosjean | |
| 10,136,226 B2 | 11/2018 | Ravnkilde et al. | |
| 10,167,189 B2 | 1/2019 | Zhang et al. | |
| 2010/0059244 A1* | 3/2010 | Ishii ..................... | H01L 24/11 174/50.5 |
| 2014/0217521 A1* | 8/2014 | Johari-Galle ......... | B81B 3/0072 257/415 |
| 2015/0131250 A1* | 5/2015 | Isaacs .................. | H05K 1/0209 361/767 |
| 2016/0090297 A1* | 3/2016 | Zhang .................. | B81B 7/0048 257/417 |
| 2016/0096724 A1* | 4/2016 | Dawson ................ | B81B 7/0048 257/418 |

(Continued)

FOREIGN PATENT DOCUMENTS

| | | |
|---|---|---|
| DE | 102005031379 A1 | 2/2006 |
| DE | 112004001150 T5 | 6/2006 |

(Continued)

*Primary Examiner* — Nduka E Ojeh
(74) *Attorney, Agent, or Firm* — Slater Matsil, LLP

(57) ABSTRACT

A MEMS device is disclosed. In an embodiment a MEMS device includes a substrate having an active region and at least one integrated electrical and mechanical connection element configured to electrically and mechanically mount the MEMS device to a carrier, wherein the connection element comprises a stress-reducing structure.

16 Claims, 6 Drawing Sheets

(56) References Cited

U.S. PATENT DOCUMENTS

| | | |
|---|---|---|
| 2016/0290883 A1 | 10/2016 | Schumm et al. |
| 2017/0073218 A1* | 3/2017 | Kaanta ................. B81B 7/0048 |
| 2018/0016134 A1 | 1/2018 | Rombach |
| 2019/0119102 A1* | 4/2019 | Oja .................... B81C 1/00325 |

FOREIGN PATENT DOCUMENTS

| | | |
|---|---|---|
| DE | 102012203699 A1 | 9/2013 |
| DE | 112012007235 T5 | 9/2015 |
| DE | 102015116556 A1 | 3/2016 |
| DE | 102015100757 B3 | 6/2016 |
| DE | 102015101878 A1 | 8/2016 |
| WO | WO-2017191365 A1 * 11/2017 ........... B81B 7/0048 |

* cited by examiner

MEMS DEVICE STRESS-REDUCING STRUCTURE

CROSS-REFERENCE TO RELATED APPLICATIONS

This application claims the priority of German patent application 102018113498.3, filed on Jun. 6, 2018, which application is hereby incorporated herein by reference.

TECHNICAL FIELD

Embodiments of the present invention are related to a MEMS (micro-electromechanical system) device.

BACKGROUND

When a MEMS die is mounted to a carrier via flip-chip bonding (FCB), a solder is usually used to directly connect electrical contacts of the die to corresponding contacts on the carrier. The solder provides an electrical and a mechanical connection of the MEMS die to the carrier. The solder connection between the MEMS die and the carrier in the FCB approach is comparatively rigid, so that a mismatch of the coefficients of thermal expansion (CTE) of the carrier and MEMS die causes stress on the MEMS die during reflow soldering cycles or other temperature ramps. This leads to a temperature dependent behavior of the MEMS die in the elastic regime, but also, governed by solder creep, to reflow shifts of characteristic properties of the MEMS die in the inelastic regime.

As an alternative to the FCB approach the MEMS die can be glued onto the substrate and the electrical contacts of the MEMS die can be wire-bonded to carrier contacts. The glue can be chosen to be soft enough, so that the glue can compensate the CTE mismatch between the carrier and the MEMS die, thus reducing the stress on the MEMS die induced by temperature changes. However, such die-and-wire bonding approach sets limits to the miniaturization of a device, since the wires require a certain height of the package as well as a sufficiently large surface area on the carrier.

In a different concept, additional spring structure elements are introduced between the carrier and the electrical contacts of the MEMS die, wherein the spring structure elements take over the task of stress compensation. Drawbacks of these structures include for instance the required additional steps in the packaging process and the risk of breakage in case of mechanical shock events.

SUMMARY

Embodiments provide a MEMS device with an electrical and mechanical connection element.

According to at least one embodiment, a MEMS device comprises an active region. Preferably, the MEMS device can comprise or consist of a MEMS die, the MEMS die comprising the active region. Besides micro-electromechanical systems, the expression "MEMS" includes also micro-opto-electromechanical systems, nano-electromechanical systems and nano-opto-electromechanical systems as well as, for example, other devices of an acoustic type or a sensor type having one or several cavities with a controlled atmosphere or with a vacuum. The active region may, for example, include one or more active regions of one or more of a microphone, a surface acoustic wave (SAW) filter or resonator, a bulk acoustic wave (BAW) filter or resonator, an accelerometer, a gyroscope, a micro tube, a sensor, a mirror, a resonator, a mechanical filter, a switch, a circuit, a cantilever beam, a bridge beam, a capacitor switch, a contact switch and a relay. Typically, the active region of the MEMS device can comprise oscillating elements or elements that are designed to move very fast.

According to a further embodiment, the MEMS device comprises a substrate on which and/or in which the active region is at least partly formed. The substrate can also be denoted as "bulk" and can be structured to form at least a part of the active region. Preferably, the substrate can comprise silicon or can substantially comprise silicon. Furthermore, additional elements and components such as electrically conducting layers and/or electrically isolating layers and/or electrical components can be arranged in and/or on the substrate.

According to a further embodiment, the MEMS device is designed to be mountable on a carrier by a flip-chip bonding process. The MEMS device comprises at least one integrated electrical and mechanical connection element for electrically and mechanically mounting the MEMS device to the carrier. In the following, the at least one integrated electrical and mechanical connection element can also be denoted in short as "connection element". The connection element is electrically connected to the active region so that the active region can be electrically contacted from the outside via the connection element. For example, the MEMS device can comprise a conductor track leading from the connection element to the active region. Preferably, the MEMS device comprises a plurality of connection elements. The description before and in the following equally applies to one connection element, to a plurality of connection elements as well as, preferably, to all connection elements of the MEMS device. The at least one connection element is designed for mounting the MEMS device to a carrier by soldering the connection element to the carrier, thereby establishing a mechanical and electrical connection between the carrier and the MEMS device.

According to a further embodiment, the at least one connection element comprises a stress-reducing structure. In particular, the stress-reducing structure is designed to reduce mechanical stress. Preferably, the stress-reducing structure is designed to reduce the mechanical coupling of the active region of the MEMS device to a carrier onto which the MEMS device is mounted via the at least one connection element, so that the above-mentioned negative effects of mounting methods in the prior art can be reduced or even avoided. While the prior art concepts for compensating mechanical stress target the packaging process, the stress-reducing structure of the MEMS device described herein is part of the connection element and thereby of the MEMS device itself, so that the problem of stress relief is addressed by the MEMS-device structure itself. In particular, stress relief is achieved by minimizing the mechanical stress that is transferred to the active region of the MEMS device. In the following, exemplary embodiments of connection elements with stress-reducing structures are described. The features of the exemplary embodiments can also be combined.

According to a further embodiment, the at least one connection element and, in particular, the stress-reducing structure of the connection element is at least partly formed by a part of the substrate. In particular, the at least one connection element comprises at least one contact pad on the substrate, the at least one contact pad being at least partially surrounded by a trench in the substrate. In other words, the substrate—or bulk—of the MEMS device is structured in the region of the connection element by forming the trench, so that the contact pad is at least partly and preferably as much as possible mechanically disconnected from the active region of the MEMS device. The contact pad can comprise or be for instance a solder pad and/or a solder bump. Furthermore, the at least one contact pad can have a diameter of several tens of micrometers, and typically of about 100 µm.

For example, the trench can have a shape which at least partly surrounds the at least one contact pad of the at least one connection element. Preferably, the trench can have a round shape as, for example, a circular or elliptical shape or at least a part thereof. The depth of the trench can preferably be chosen to be at least 30 µm. Furthermore, the depth of the trench can be chosen to be not more than a maximum depth, wherein the maximum depth corresponds to such depth for which the residual thickness of the substrate, measured from a bottom surface of the trench to the remote outer surface of the substrate, is at least 20 µm or at least 30 µm. The trench can have a width of equal to or greater than 10 µm and equal to or less than 100 µm. Due to the trench, the part of the substrate on which the contact pad is arranged can at least partly be formed in a column-like fashion.

For example, the trench can be an interrupted trench, which partially surrounds the at least one contact pad. In other words, the trench does not form a closed-ring-like structure around the at least one contact, but is interrupted by a fillet. The fillet, which is that part of the substrate which would have to be removed if the trench should completely surround the at least one contact pad, can ensure a path on the substrate surface on which a conductor track can be arranged, wherein the conductor track connects the at least one contact pad to the active region. Consequently, the at least one contact pad can be connected to the active region by a conductor track, the conductor track being arranged on a continuous path on the substrate from the contact pad to the active region, wherein the continuous path is free of the trench and does not cross the trench. Such interrupted trench can be produced, for instance, by a deep etching process or by an etching process based on KOH (caustic potash).

Furthermore, the trench can completely surround the at least one contact pad of the at least one connection element, thereby forming a closed-ring-like structure around the at least one contact pad. The at least one contact pad can be connected to the active region by a conductor track, wherein the conductor track is partly arranged on a bridge element which reaches over the trench. Such structure can be produced for instance by a release etching process, which is widely used in MEMS technology.

In case of an interrupted trench as well as in case of a completely surrounding trench, the remaining mechanical path, passing the trench via the fillet or the bridge element, can be designed such that the resulting forces caused by temperature-induced mechanical stress as well as stress caused by other effects do not focus toward the active region. Preferably, the remaining mechanical path and, in particular, the fillet or the bridge element can be oriented substantially tangentially in regard to the active region.

According to a further embodiment, the connection element comprises at least two associated contact pads. Here and in the following, associated contact pads denote contact pads which are arranged in direct vicinity to each other and which are electrically connected to the same contact on a carrier and to the same part of the active region. In other words, a sub-structure is introduced so that a single contact pad for a solder connection is replaced by two or more contact pads, forming correspondingly two or more solder connections which are electrically connected in parallel. Preferably, each of the associated contact pads has a smaller cross section than in the case of only a single contact pad. As a consequence, the transfer of mechanical stress through the solder connection to the active region is reduced without compromising the stability of the connection in case of mechanical shock events or temperature cycles. The associated contact pads and, thus, the multiple solder connections are preferably arranged tangentially with respect to the active region, so that the mechanical stress component critical to the active region's functionality is reduced. It could also be that the mechanical stress component in a less critical direction might be increased.

Furthermore, each of the associated contact pads can have an elongated cross-section. Consequently, the shape of the contact pads is designed to produce solder connections of a certain shape to steer the active-region-affecting stress directions. Preferably, each of the associated contact pads has a maximum extension direction which is oriented substantially tangentially in regard to the active region. For example, each of the associated contact pads can have an elliptical cross-section, wherein the longer axis is oriented tangentially in regard to the active region. Such contact pad shape is also possible in case of a single contact pad.

According to a further embodiment, the connection element comprises a metal mixed with a filler. Here and in the following, the term "metal" can denote pure metals as well as mixtures and/or alloys of at least two or more metals. Due to the filler in the metal, the metal can be rendered less rigid compared to the metal without the filler. Preferably, the filler comprises a plurality of filler elements, which are dispersed in the metal. Preferably, each of the filler elements has a filler element diameter which is equal to or less than $1/10$ of the connection element diameter and, in particular, of the diameter of the structure formed by the metal.

Preferably, the connection element can comprise a solder metal. The connection element can have a solder-bump-like structure, which can be formed on the substrate, on a conductor track and/or on a contact pad.

According to a further embodiment, the filler comprises a gas. In other words, the connection element preferably contains a plurality of voids, which are at least gas-filled and which form the filler elements. In order to produce such voids, a material chosen from an organic material, water, solder flux or the like can be mixed to the solder metal, wherein the material produces a gas before and/or during the solder process, thereby forming the voids. Alternatively or additionally, the filler can comprise a plastic material, for example a silicone, which can be added as powder or beads to the metal. In this case, the connection element can comprise particles dispersed in the metal, the particles forming the filler elements.

In a preferred embodiment, by means of the filler a material can be added to a metal, preferably a solder metal, which leads to an intended formation of voids or particles in the finished solder connection, which is consequently rendered less rigid than the metal without the voids or particles. This can reduce the maximum stress levels occurring in the event of thermal expansion, thus increasing the critical temperature at which plastic deformation of the solder joint occurs. Likewise, in case of plastic deformation, for instance during reflow soldering, the maximum stress transferred to the active region is reduced.

Whereas prior art concepts of stress decoupling require additional structures and processes and/or whereas a miniaturization is limited by the necessary sub-structures like wire loops or spring contacts, in the MEMS device described herein a stress-reducing structure can be integrated directly into the device as well as in the production process by means of the connection element, so that a standard FCB process can be used for mounting the MEMS device with the integrated stress-reducing structure. The stress-reducing structure according to the described embodiments can compensate temperature-induced stress as well as stress caused by other effects. For instance, the stress-reducing structure can compensate assembly stress caused during the final assembly of the device by a customer and/or internal stress, for example, caused by a package assembly of the device.

BRIEF DESCRIPTION OF THE DRAWINGS

Further features, advantages and expediencies will become apparent from the following description of exemplary embodiments in conjunction with the figures.

In the figures, elements of the same design and/or function are identified by the same reference numerals. It is to be understood that the embodiments shown in the figures are illustrative representations and are not necessarily drawn to scale.

DETAILED DESCRIPTION OF ILLUSTRATIVE EMBODIMENTS

Figure 1A:
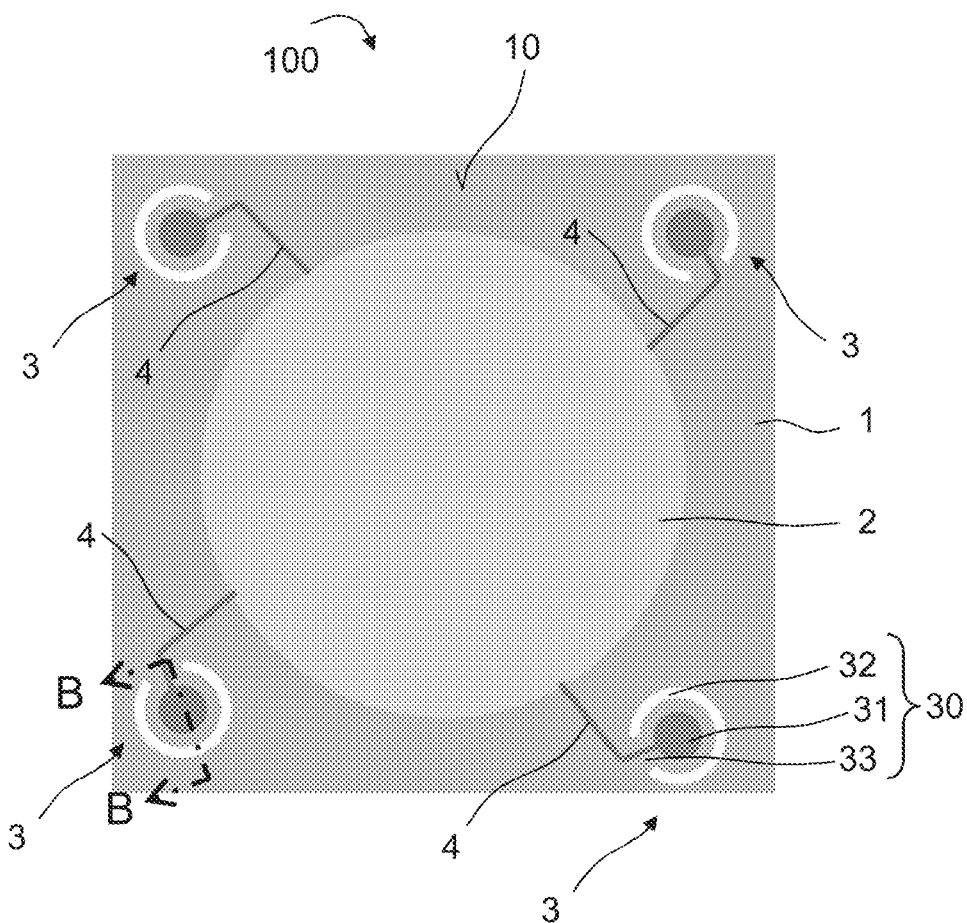
FIGS. 1A and 1B show schematic drawings illustrating a MEMS device according to an embodiment.

In the following, specific details are set forth, such as embodiments and features of the MEMS device as well as advantageous effects thereof, in order to provide a thorough understanding of embodiments of the invention. It will be apparent to one skilled in the art that embodiments of the invention may also be put into practice without these specific details.

The MEMS device 100 according to the embodiments shown in the figures is not restricted to a certain type of device but can comprise functionalities of one or more of a microphone, a SAW filter or resonator, a BAW filter or resonator, an accelerometer, a gyroscope, a micro tube, a sensor, a mirror, a resonator, a mechanical filter, a switch, a circuit, a cantilever beam, a bridge beam, a capacitor switch, a contact switch and a relay as well as of other devices of an acoustic type or a sensor type having one or several cavities with a controlled atmosphere or with a vacuum. Consequently, the MEMS device 100 according to the embodiments shown in the figures has an active region 2, which can comprise one or more active regions with one or more of the before-mentioned functionalities. Therefore, in the figures the MEMS device 100 and, in particular, the active region 2 are shown merely schematically.

The MEMS device 100 according to the embodiments shown in the figures is mountable on a carrier by means of an FCB process and comprises at least one integrated electrical and mechanical connection element 3 for electrically and mechanically mounting the MEMS device 100 to the carrier by such an FCB process. In particular, the MEMS device 100 according to the embodiments shown in the figures comprises a plurality of integrated electrical and mechanical connection elements 3. The position and the number of the integrated electrical and mechanical connection elements 3 shown in the figures are merely exemplary and can also deviate from the shown embodiments. In each embodiment shown in the figures, each of the integrated electrical and mechanical connection elements 3 comprises a stress-reducing structure 30, which is designed to reduce mechanical stress, for example, due to temperature changes of the MEMS device 100, that can have negative effects on the active region 2. In particular, the stress-reducing structures 30, which are integrated parts of the MEMS device 100, are designed to reduce the mechanical coupling of the active region 2 to a carrier onto which the MEMS device 100 is mounted via the integrated electrical and mechanical connection elements 3.

Figure 1B:
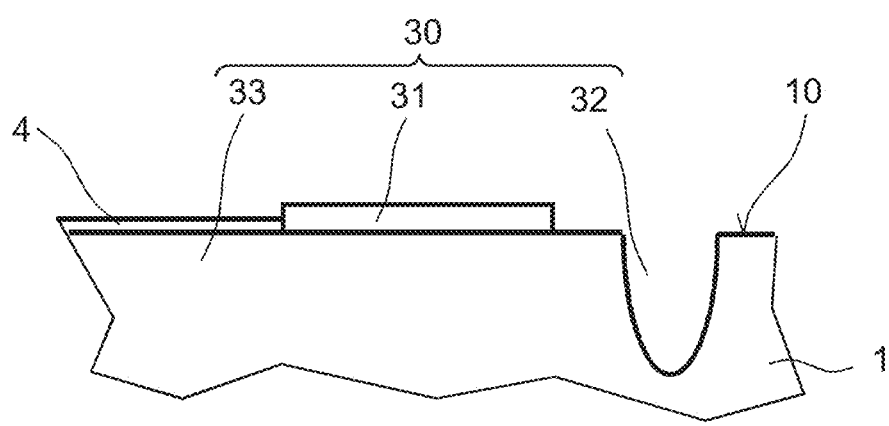

FIG. 1 shows schematic drawings of an embodiment of the MEMS device 100, wherein FIG. 1A shows a view of the MEMS device 100 onto a mounting side 10, which faces a carrier when the MEMS device 100 is mounted onto the carrier, while FIG. 1B shows a partial sectional view along the section plane BB indicated in FIG. 1A. The following description refers to both FIGS. 1A and 1B.

By way of example, the MEMS device 100 is embodied as a MEMS die having a substrate 1 with a quadratic cross-section, comprising an active region 2 and four integrated electrical and mechanical connection elements 3, which are connected to the active region 2 via conductor tracks 4.

The substrate 1—or bulk—substantially comprises silicon. By means of structuring and applying suitable components and layers made from electrically conducting and/or electrically isolating materials, the active region 2 is formed.

As mentioned before, each of the integrated electrical and mechanical connection elements 3, in the following also denoted in short as connection elements 3, comprises a stress-reducing structure 30. Since all connection elements 3 are formed similarly, only one connection element 3 is provided with reference numerals in FIG. 1A. Each of the stress-reducing structures 30 is partly formed by a part of the substrate 1. In particular, the connection elements 3 and, in particular, the stress-reducing structures 30 comprise at least one contact pad 31, which can preferably be a solder pad and which is soldered to the carrier when mounting the MEMS device 100. The contact pads 31 can each have a diameter of several tens of micrometers, and typically of about 100 µm.

The connection elements 3 and, in particular, the stress-reducing structures 30 further comprise a trench 32, wherein each of the trenches 32 partly surrounds the respective contact pad 31. Consequently, the substrate 1 is structured in the region of the connection elements 3 by forming the trenches, so that the contact pads 31 are positioned on column-like structures of the substrate 1 and at least partly and preferably as much as possible mechanically disconnected from the active region 2. The depth of the trenches 32 is preferably at least 30 µm and equal to or less than a maximum depth, which corresponds to such depth that the residual thickness of the substrate 1, measured from a bottom surface of the trenches 32 to the outer surface of the substrate 1 remote from the mounting face 10, is at least 20 µm or at least 30 µm. The trenches 32 can preferably have a width of equal to or greater than 10 µm and equal to or less than 100 µm.

As indicated in FIG. 1A, the trenches 32 can have a round shape, which can for example, be circular or, alternatively, elliptical. The trenches 32 can be produced for instance by a deep-etching process or by etching with KOH (caustic potash). The trenches 32 are interrupted trenches, wherein each of the trenches 32 partially surrounds the respective contact pad 31, so that the trenches 32 do not form closed-ring-like structures around the contact pads 31 but are interrupted by a fillet 33. The fillets 33 provide paths on the mounting surface 10 between the contact pads 31 and the active region 2, on which for each of the connection elements 3 the respective conductor track 4 can be arranged. Consequently, the conductor tracks 4 can be arranged on continuous, trench-free paths on the mounting surface 10 from the contact pads 31 to the active region 2. It is also possible that the conductor tracks 4 are at least partly arranged below the mounting surface 10 and run in a deeper layer of the substrate.

By arranging the fillets 33 in suitable positions and directions, it can be possible that the resulting forces of the mechanical path between the connection elements 3 and the active region 2 do not focus toward the active region 2. As shown in FIG. 1A, the fillets 33 can be arranged in a substantially tangential direction with respect to the active region 2. With such preferable routing with the fillets 33 extending into a similar direction for each connection element 3, the resulting forces can act tangentially in a common rotational sense.

Figure 2:
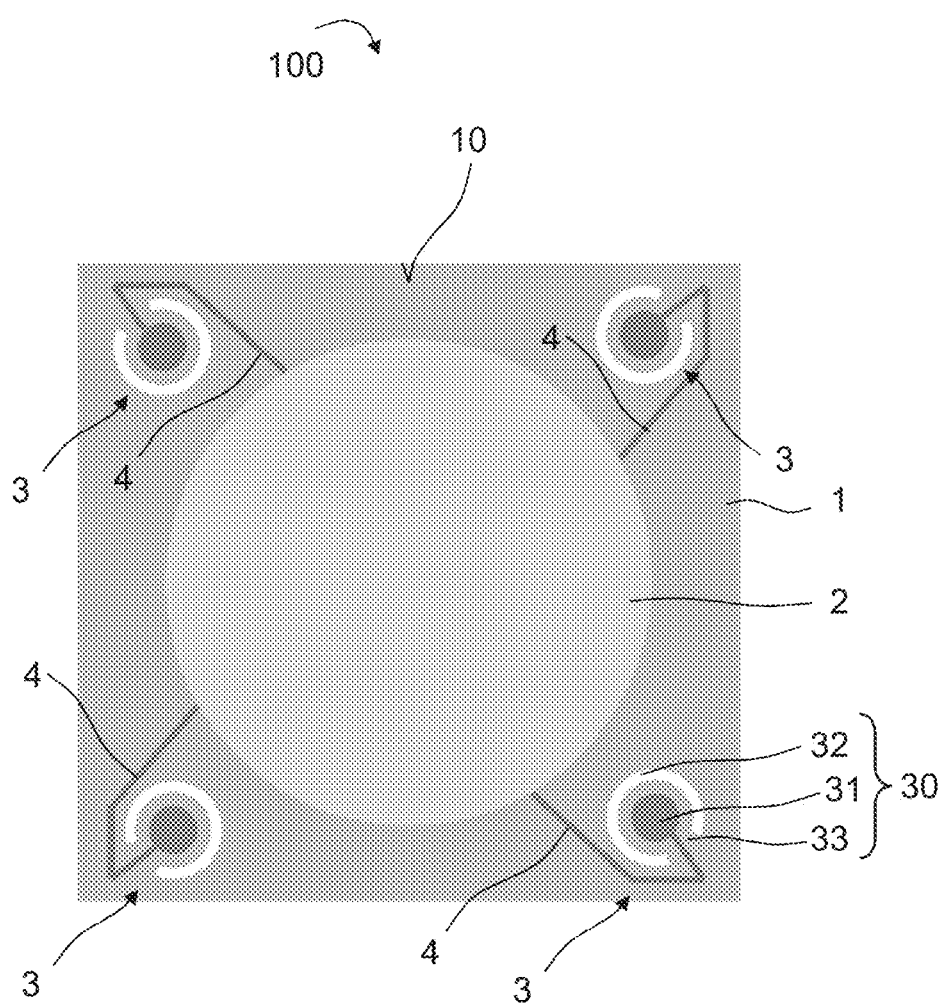
FIG. 2 shows a schematic drawing illustrating a MEMS device according to a further embodiment.

In FIG. 2 a further embodiment of the MEMS device 100 is shown, which represents a modification of the embodiment of FIGS. 1A and 1B. In contrast to the foregoing embodiment, the fillets 33 of the connection elements 3 and thus the remaining mechanical paths between the connection elements 3 and the active region 2 are oriented radially outward with respect to the active region 2, which can also help reducing stress-induced forces acting on the active region 2.

Figure 3A:
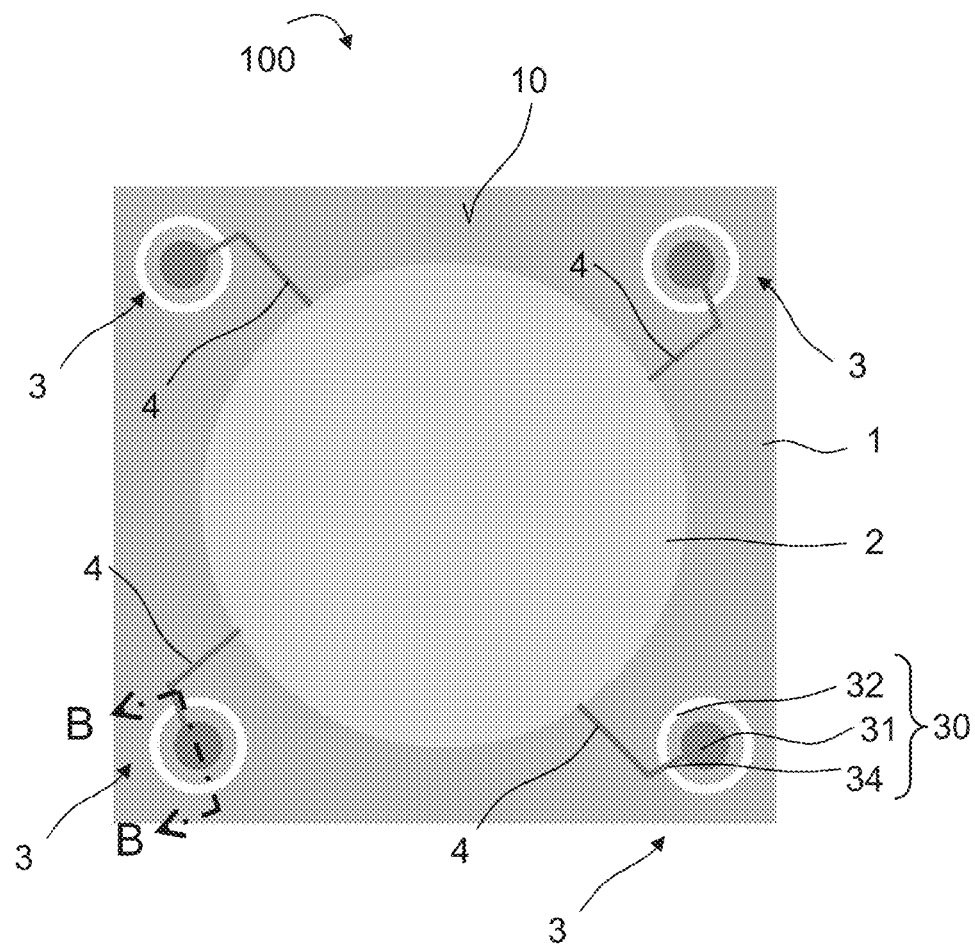
FIGS. 3A and 3B show schematic drawings illustrating a MEMS device according to a further embodiment.
Figure 3B:
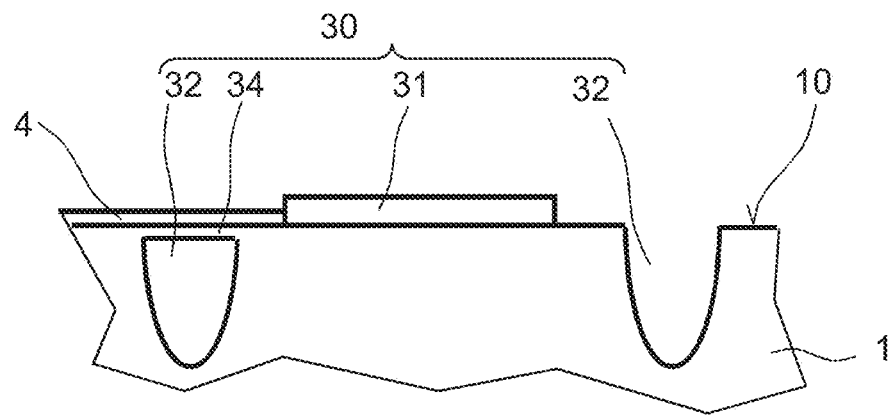

In FIGS. 3A and 3B, which show views corresponding to FIGS. 1A and 1B, a further embodiment of the MEMS device 100 is shown, which has, in contrast to the foregoing embodiments, connection elements 3 with stress-reducing structures 30 with trenches 32 which completely surround the respective contact pads 31. Consequently, the trenches 32 form closed-ring-like structures around the respective contact pads 31. In order to provide a continuous path between the contact pad 31 of a connection element 3 and the active region 2, on which the conductor track 4 can be arranged, each of the connection elements 3 and, in particular, each of the stress-reducing structures 30 comprises a bridge element 34 that reaches over the trench 32 from the column-like structure of the substrate 1, on which the contact pad 31 is arranged, to the surrounding mounting area 10. The bridge elements 34 can be produced for instance by a release etching process, wherein the trenches 32 can have a depth of several micrometers, for instance about 4 μm, at least below the bridge elements 34. The remaining parts of the trenches 32 can either be also produced by release etching, or alternatively by the etching processes described in connection with the foregoing embodiments.

Figure 4:
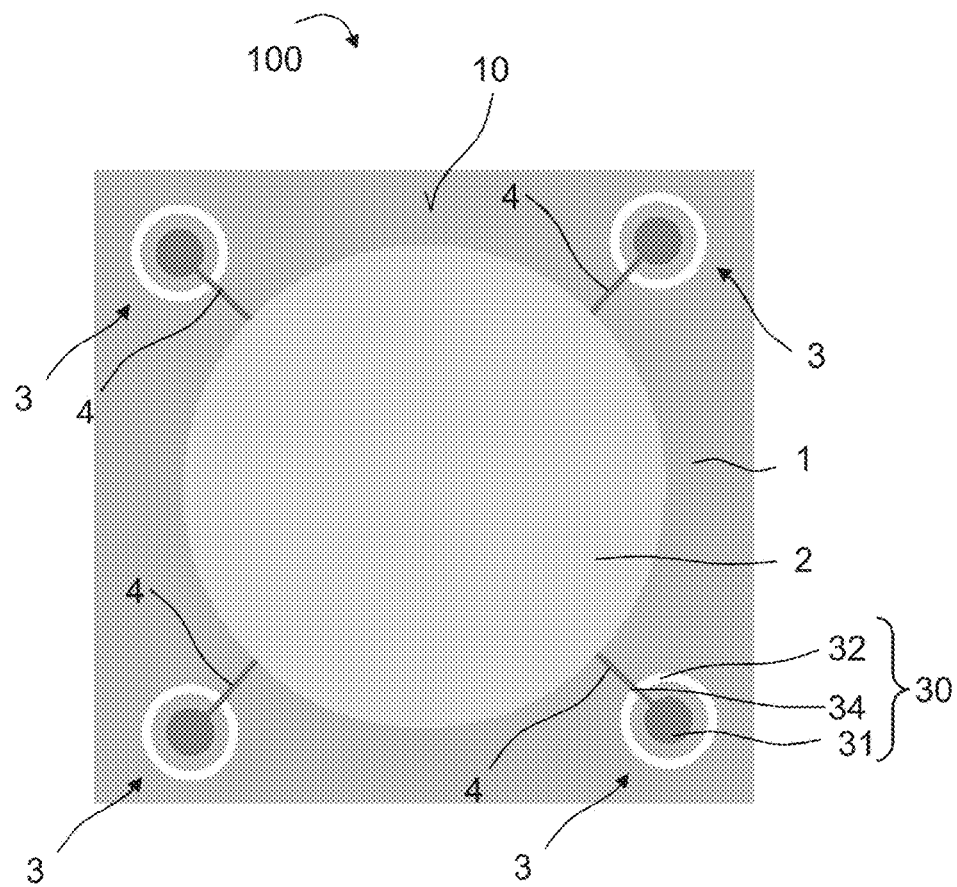
FIG. 4 shows a schematic drawing illustrating a MEMS device according to a further embodiment.

Similarly to the fillets described in connection with the foregoing embodiments, the bridge elements 34 can be arranged in suitable positions and directions, so that it can be possible that the resulting forces of the mechanical path between the connection elements 3 and the active region 2 do not focus toward the active region 2. As shown in FIG. 3A, the bridge elements 34 can be arranged in a substantially tangential direction with respect to the active region 2. Alternatively, as shown in a further embodiment in FIG. 4, the bridge elements 34 of the connection elements 3 and thus the remaining mechanical paths between the connection elements 3 and the active region 2 can be oriented radially with respect to the active region 2.

Figure 5:
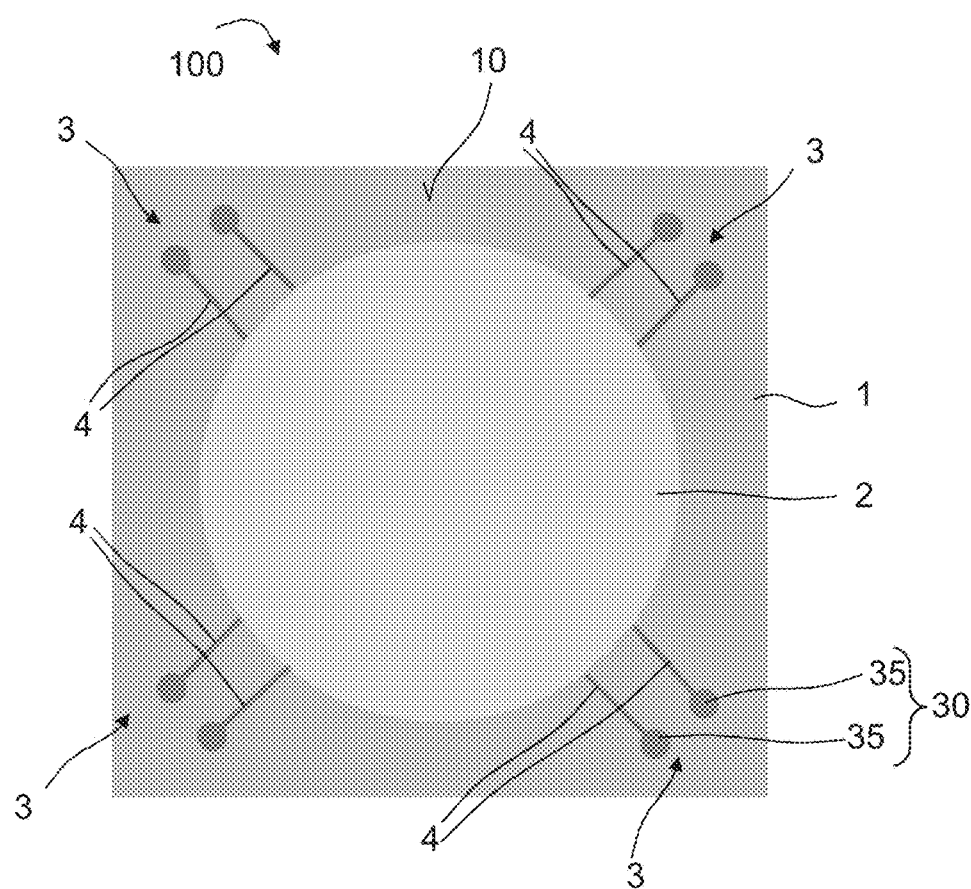
FIGS. 5 and 6 show schematic drawings illustrating MEMS devices according to further embodiments.
Figure 6:
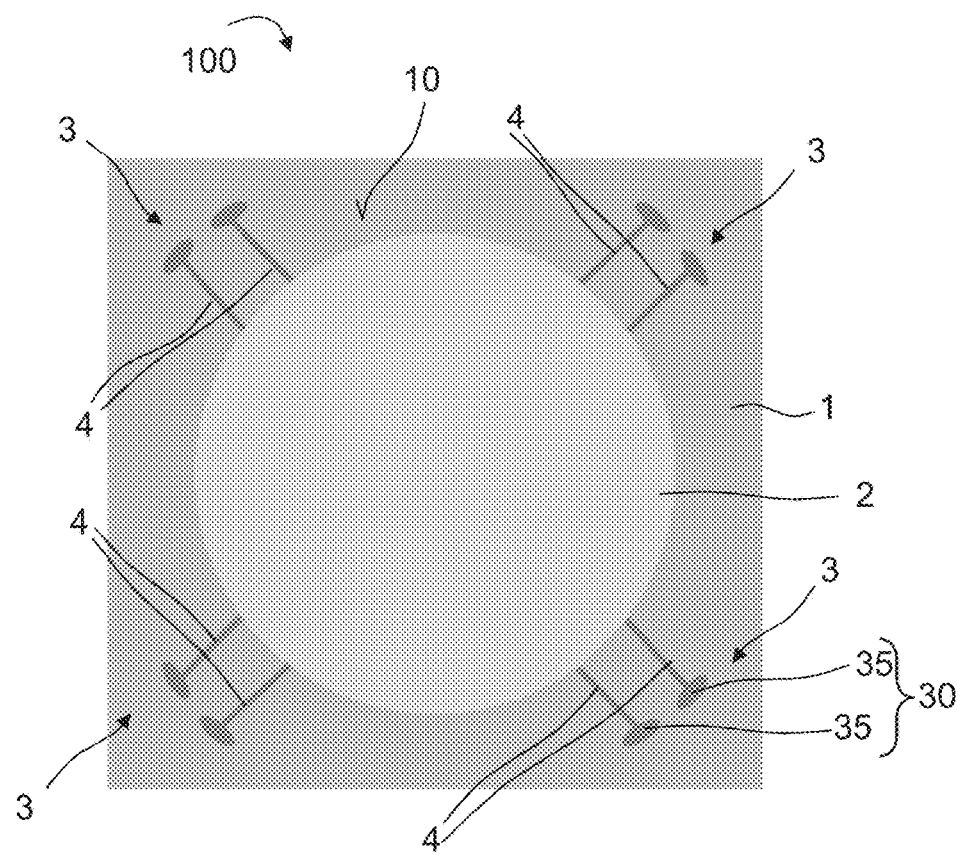

In FIGS. 5 and 6 further embodiments of the MEMS device 100 are shown. In contrast to the foregoing embodiments, each of the connection elements 3 comprises at least two associated contact pads 35 instead of only one contact pad 31, the at least two associated contact pads 35 of each of the connection elements 3 being part of the respective stress-reducing structure 30. Although in FIGS. 5 and 6 each of the connection elements 3 is shown with two associated contact pads 35, the connection elements 3 can also comprise more than two associated contact pads 35, respectively.

As explained in the general part of the description, the associated contact pads 35 are arranged in direct vicinity to each other and form a sub-structure, by means of which a single contact pad for a solder connection is replaced by the associated contact pads 35, forming correspondingly two or more solder connections which are electrically connected in parallel. When mounting the MEMS device 100 to a carrier, all associated contact pads 35 of each of the connection elements 3 can be connected to the same contact on the carrier, respectively. By means of individual conductor tracks 4, all associated contact pads 35 of a connection element 3 can be connected to the same part of the active region 2. Thus, by means of the associated contact pads 35, a single contact pad with a single conductor track 4 is split into two or more associated contact pads 35 with associated conductor tracks 4. Alternatively, the associated contact pads 35 of a connection element 3 can be connected to a common conductor track leading to the active region 2.

Preferably, each of the associated contact pads 35 has a smaller cross section than in the case of a connection element 3 with only one contact pad. As a consequence, the transfer of mechanical stress through the solder connection to the active region 2 is reduced without compromising the stability of the connection in case of mechanical shock events or temperature cycles. The associated contact pads 35 and thus the multiple solder connections of each of the connection elements 3 are preferably arranged such that the mechanical stress component critical to the active region's functionality is reduced. As shown in FIGS. 5 and 6, the associated contact pads 35 are preferably placed substantially tangentially with respect to the active region 2, so that stress on the active region 2 can be reduced.

As shown in FIG. 5, the associated contact pads 35 can have a shape with a circular cross-section. Alternatively, as shown in FIG. 6, each of the associated contact pads 35 can have an elongated cross-section. Such shape of the contact pads 35 can produce solder connections which can steer the active-region-affecting stress directions. Preferably, each of the associated contact pads 35 has a maximum extension direction which is oriented substantially tangentially in regard to the active region 2. As indicated in FIG. 6, each of the associated contact pads 35 can, for example, have an elliptical cross-section, wherein the longer axis is oriented substantially tangentially in regard to the active region 2.

Figure 7:
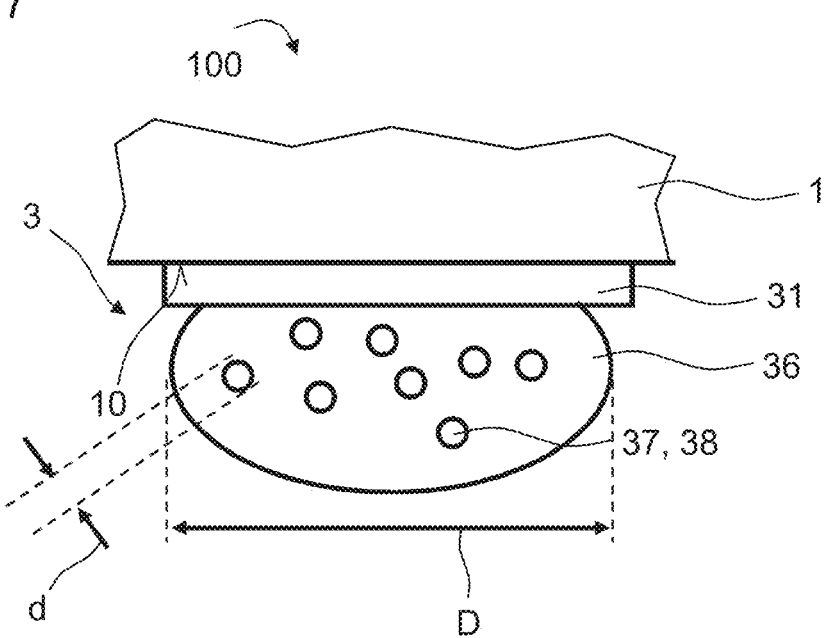
FIGS. 7 and 8 show schematic drawings illustrating MEMS devices according to further embodiments.
Figure 8:
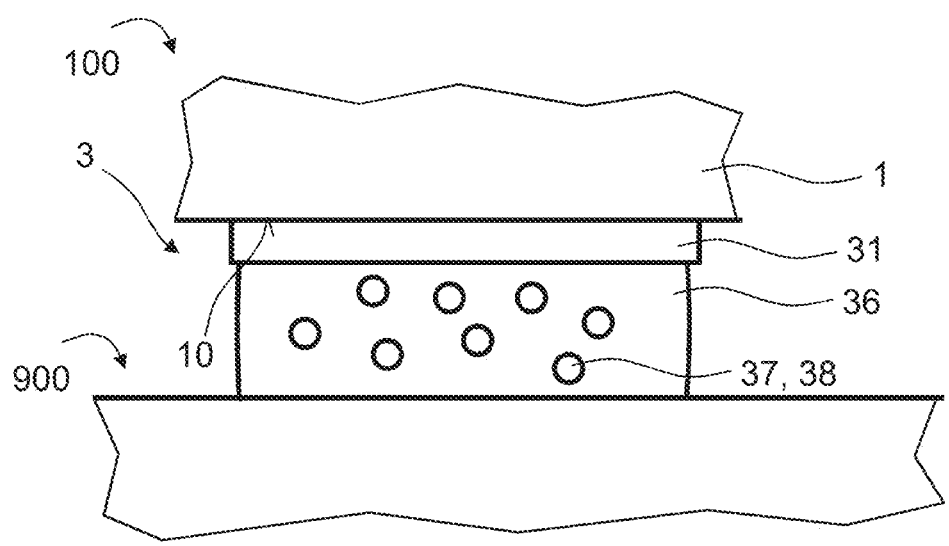

FIGS. 7 and 8 show partial views of further embodiments of the MEMS device 100. In particular, both FIGS. 7 and 8 show a connection element 3 of the MEMS device 100, wherein the connection element 3 comprises a metal 36 mixed with a filler 37. In contrast to the embodiment of FIG. 7, FIG. 8 shows an embodiment of the MEMS device 100 mounted on a carrier 900.

The metal 36 comprises or is a solder metal and forms a solder-bump-like structure, which can be applied directly on the substrate 1, on a conductor track or, as shown in FIGS. 7 and 8, on a contact pad 31. The filler 37 comprises a plurality of filler elements 38, which are dispersed in the metal 36. Preferably, each of the filler elements 38 has a filler element diameter d which is equal to or less than $\frac{1}{10}$ of a diameter of the connection element 3, which, in particular, can be given by the diameter D of the structure formed by the metal 36. Due to the filler 37 and, in particular, the dispersed filler elements 38 in the metal 36, the metal 36 can be rendered less rigid compared to the metal without the filler. This can reduce the maximum stress levels occurring in the event of thermal expansion or of other internal or external stress sources, thus increasing the critical temperature at which plastic deformation of the solder joint occurs or increasing the maximum stress at which plastic deformation occurs. Likewise, in case of plastic deformation, for instance during reflow soldering, the maximum stress transferred to the active region is reduced.

The filler 37 and, in particular, the filler elements 38 can comprise a gas. Consequently, the connection element 3 can contain a plurality of voids, which form the filler elements 38 and which are at least gas-filled. In order to produce such voids, a material chosen from an organic material, water, solder flux or the like is mixed to the metal 36, wherein the material produces a gas before and/or during a solder process, thereby forming the voids. Alternatively or additionally, the filler 37 and, in particular, the filler elements 38 can comprise a plastic material, for example a silicone, which can be added as powder or beads to the metal 36. In this case, the connection element 3 can comprise particles dispersed in the metal 36, the particles forming the filler elements 38.

Alternatively or additionally to the features described in connection with the figures, the embodiments shown in the figures can comprise further features described in the general part of the description. Moreover, features and embodiments of the figures can be combined with each other, even if such combination is not explicitly described.

The invention is not restricted by the description on the basis of the exemplary embodiments. Rather, the invention encompasses any new feature and also any combination of features, which in particular comprises any combination of features in the patent claims, even if this feature or this combination itself is not explicitly specified in the patent claims or exemplary embodiments.

What is claimed is:

1. A micro-electromechanical systems (MEMS) device comprising:
    a substrate comprising an active region;
    at least one integrated electrical and mechanical connection element on a mounting side of the MEMS device, the at least one integrated electrical and mechanical connection element configured to electrically and mechanically mount the MEMS device with the mounting side to a carrier,
    wherein the connection element comprises a stress-reducing structure,
    wherein the connection element is at least partly formed by a part of the substrate,
    wherein the connection element comprises at least one contact pad on the mounting side, and
    wherein a trench on the mounting side in the substrate completely surrounds the contact pad; and
    a conductor track partly arranged on a bridge element reaching over the trench.

2. The MEMS device according to claim 1, wherein the connection element comprises at least two associated contact pads.

3. The MEMS device according to claim 2, wherein each of the associated contact pads has an elongated cross-section.

4. The MEMS device according to claim 1, wherein the connection element comprises a metal mixed with a filler.

5. The MEMS device according to claim 4, wherein the metal is a solder metal.

6. The MEMS device according to claim 4, wherein the filler comprises a gas.

7. The MEMS device according to claim 4, wherein the filler comprises a plastic material.

8. The MEMS device according to claim 4, wherein the filler comprises a plurality of filler elements, each of the filler elements having a filler element diameter which is equal to or less than $\frac{1}{10}$ of a connection element diameter.

9. The MEMS device according to claim 4, wherein the connection element has a solder-bump-like structure.

10. A micro-electromechanical systems (MEMS) device comprising:
    a substrate comprising an active region;
    at least two integrated electrical and mechanical connection elements on a mounting side of the MEMS device, the at least two integrated electrical and mechanical connection elements configured to electrically and mechanically mount the MEMS device with the mounting side to a carrier,
    wherein each connection element comprises a stress-reducing structure,
    wherein each connection element is at least partly formed by a part of the substrate,
    wherein each connection element comprises at least one contact pad on the mounting side, and
    wherein each contact pad is completely surrounded by a trench on the mounting side; and
    a conductor track partly arranged on a bridge element reaching over the trench.

11. The MEMS device according to claim 10, wherein each connection element comprises at least two associated contact pads.

12. The MEMS device according to claim 10, wherein each connection element comprises a metal mixed with a filler.

13. The MEMS device according to claim 12, wherein the metal is a solder metal.

14. The MEMS device according to claim 12, wherein the filler comprises a gas.

15. The MEMS device according to claim 12, wherein the filler comprises a plastic material.

16. The MEMS device according to claim 12, wherein the filler comprises a plurality of filler elements, each of the filler elements having a filler element diameter which is equal to or less than $\frac{1}{10}$ of a connection element diameter.

* * * * *